United States Patent [19]
Jennings

[11] Patent Number: 5,681,216
[45] Date of Patent: Oct. 28, 1997

[54] HIGH PRECISION POLISHING TOOL

[75] Inventor: Dean Jennings, San Ramon, Calif.

[73] Assignee: Elantec, Inc., Milpitas, Calif.

[21] Appl. No.: 597,680

[22] Filed: Feb. 6, 1996

[51] Int. Cl.⁶ ................................................ B24B 57/00
[52] U.S. Cl. ........................ 451/446; 451/36; 451/461; 451/550; 451/551
[58] Field of Search ................... 451/60, 66, 285–289, 451/36, 41, 550, 548, 446, 551, 461

[56] References Cited

U.S. PATENT DOCUMENTS

| | | | |
|---|---|---|---|
| 1,890,401 | 12/1932 | Mitchell | 451/551 |
| 1,956,781 | 5/1934 | Waldron | 451/551 |
| 2,039,578 | 5/1936 | Blount | 451/551 |
| 3,715,842 | 2/1973 | Trednnick et al. | 451/36 |
| 4,490,948 | 1/1985 | Hanstein et al. | 451/446 |
| 4,821,461 | 4/1989 | Holmstrand | 451/461 |
| 5,076,024 | 12/1991 | Akagawa et al. | 451/550 |
| 5,533,923 | 7/1996 | Shamouilian et al. | 451/36 |

*Primary Examiner*—Robert A. Rose
*Assistant Examiner*—George Nguyen
*Attorney, Agent, or Firm*—Fleisler, Dubb, Meyer & Lovejoy, LLP

[57] ABSTRACT

A polishing tool having a polishing wheel that forms a set of pockets wherein the pockets receive a stream of water and are formed such that a high hydrostatic pressure builds in the pockets as the polishing tool rotates in a high precision grinding machine and addresses a surface of a substrate. The high hydrostatic pressure removes material from the surface of the substrate while preserving the precise thickness variation control of the high precision grinding machine.

10 Claims, 3 Drawing Sheets

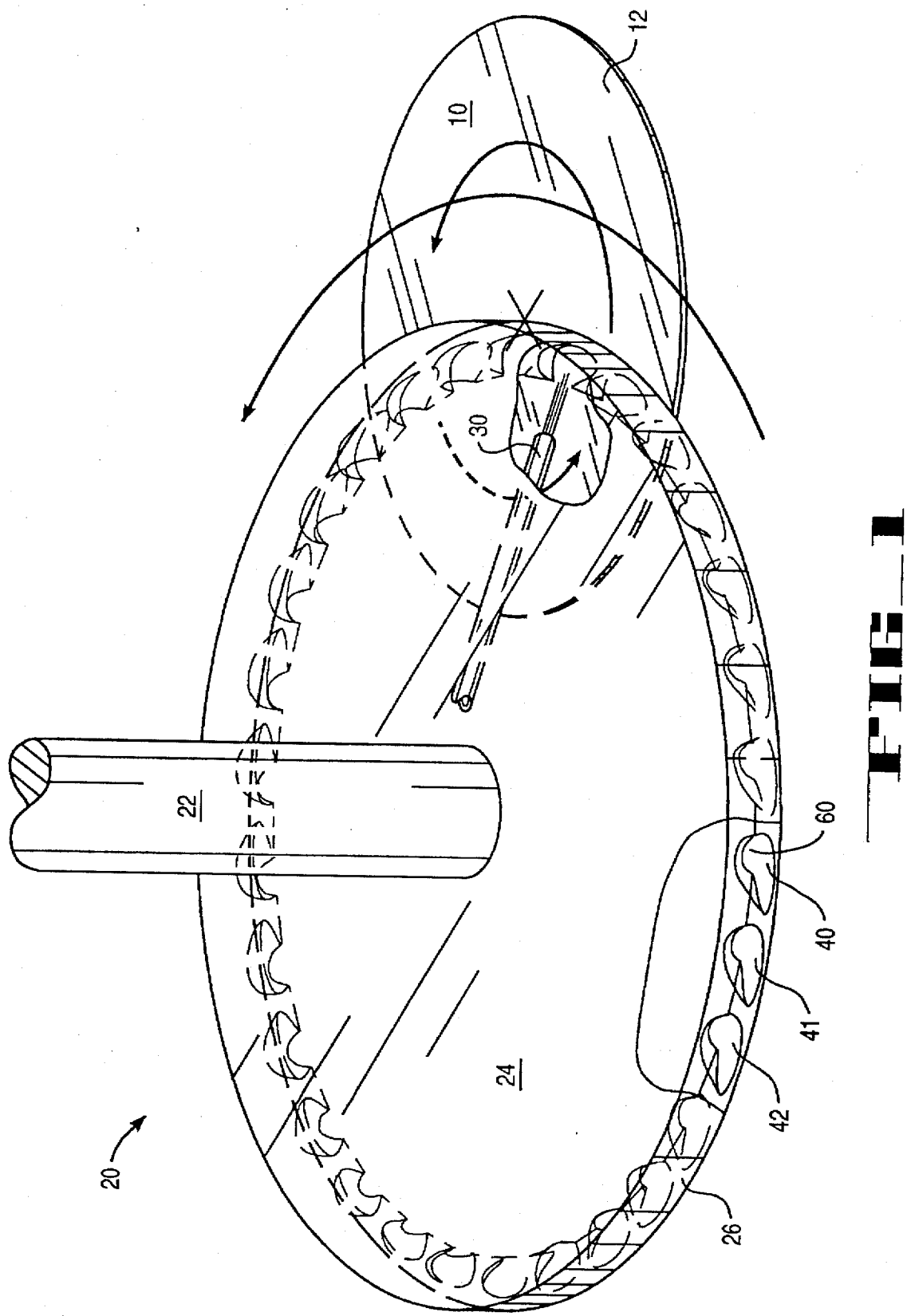
FIG—1

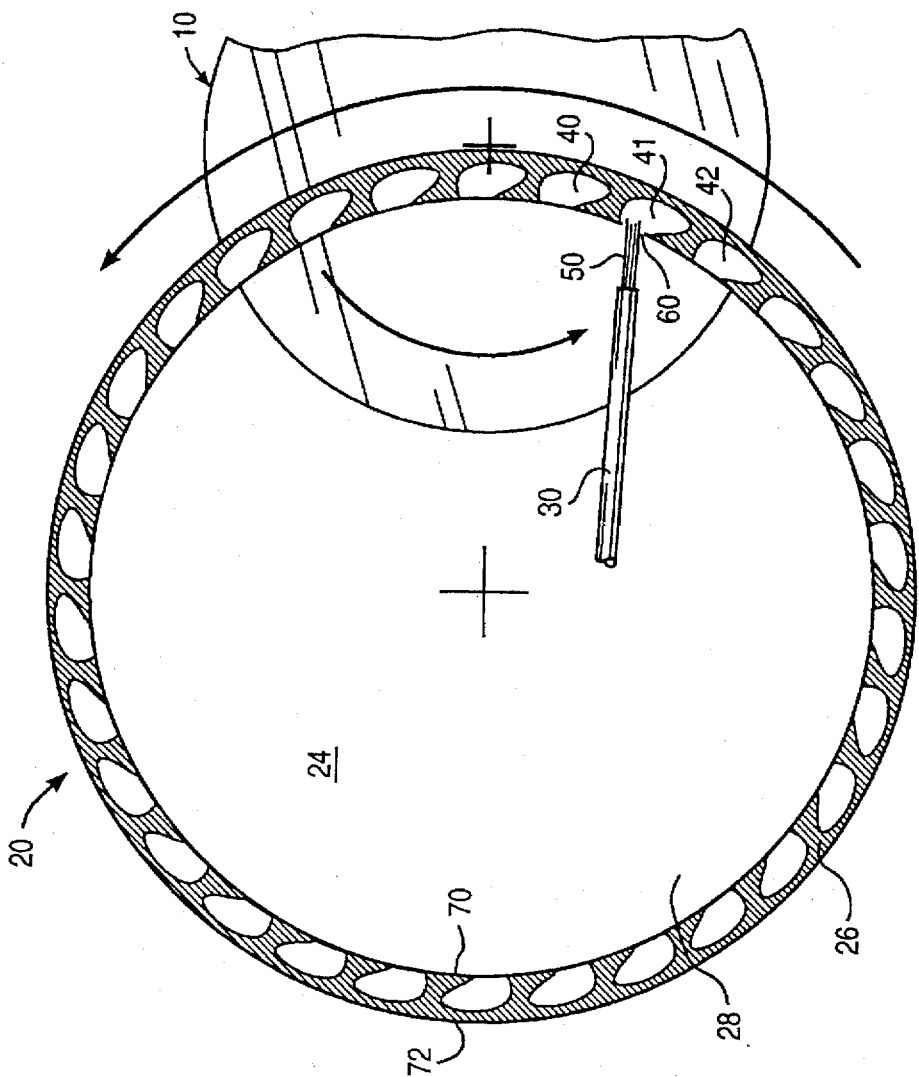
FIG._2
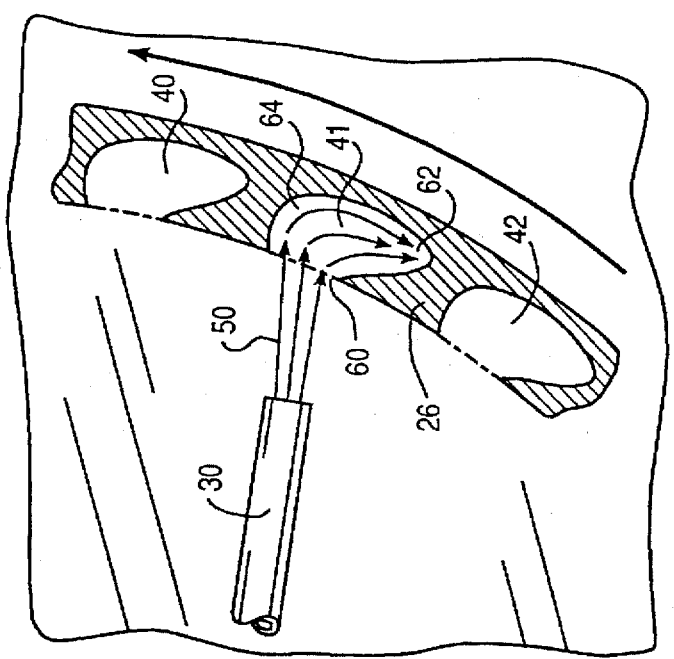
FIG._2A

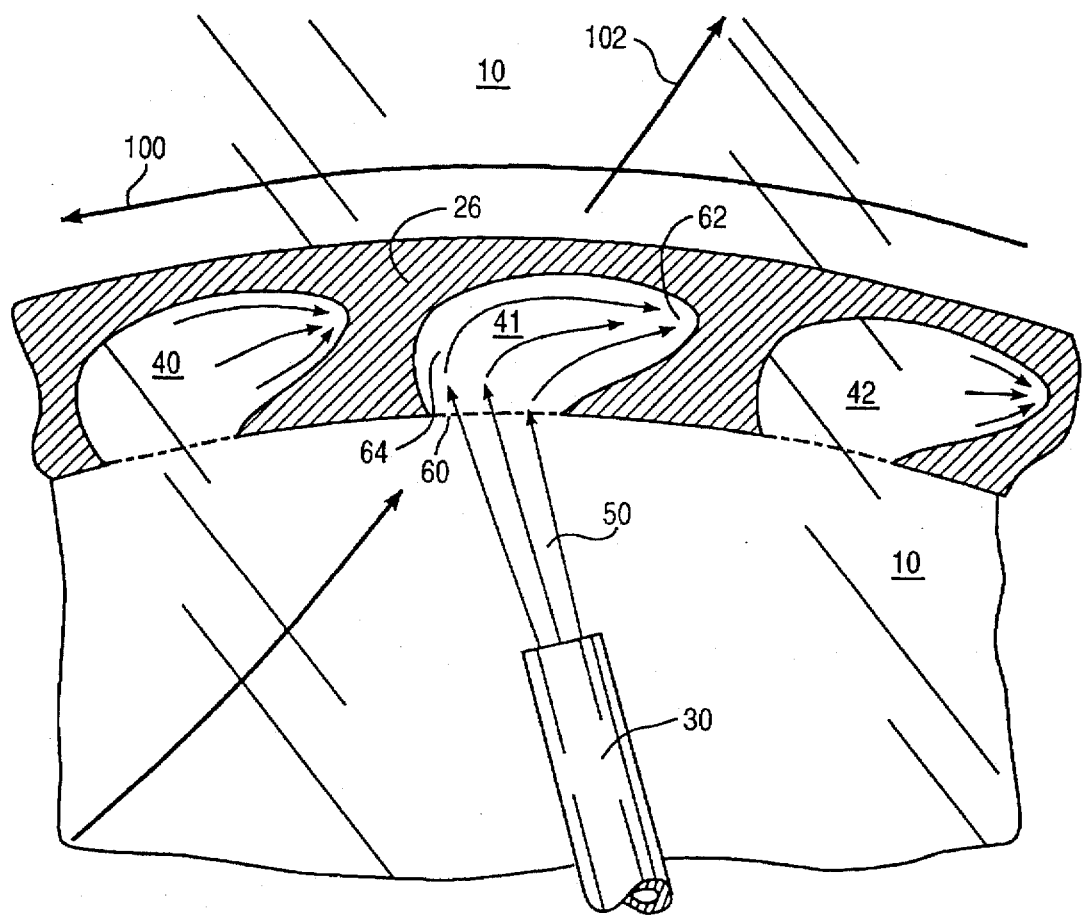
FIG_3
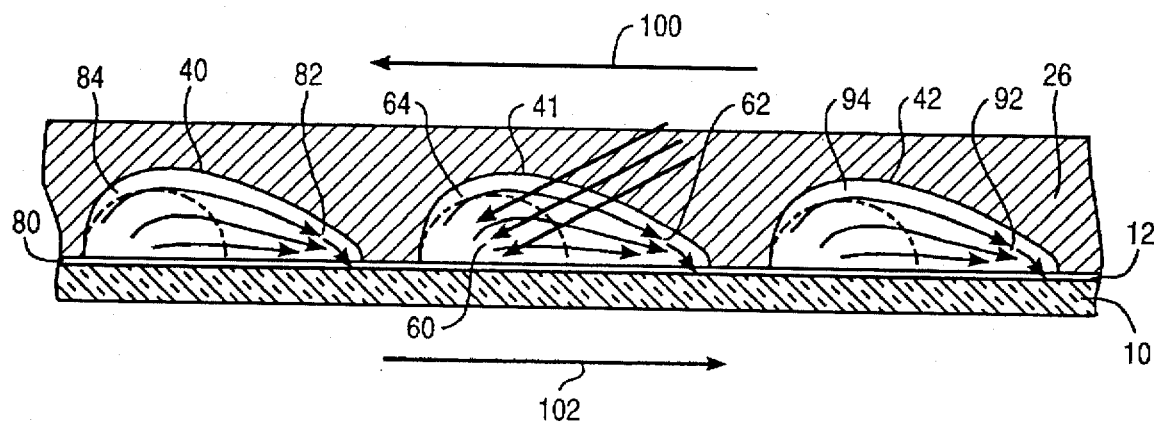
FIG_4

HIGH PRECISION POLISHING TOOL

BACKGROUND OF THE INVENTION

1. Field of the Invention

The present invention pertains to the field of manufacturing processes. More particularly, this invention relates to a high precision polishing tool for machining a smooth surface onto a substrate.

2. Art Background

Substrate manufacturing processes in the semiconductor and optics industries commonly require the formation of optically smooth surfaces on substrates. An optically smooth surface may be referred to as a mirror-polished surface. In semiconductor manufacturing, for example, a mirror polished surface on a silicon wafer substrate usually facilitates the formation of high density integrated circuit devices. Such mirror polished surfaces are also typically required during device manufacturing processes that include wafer bonding steps.

In addition, substrate manufacturing processes in the semiconductor and optics industries commonly require the formation of optically flat substrates. An optically flat substrate is one having a relatively low total indicated reading (TIR) over the entire substrate area. In semiconductor manufacturing, for example, an optically flat silicon wafer substrate typically facilitates the photolithographic techniques required to produce high density integrated circuit devices on the wafer substrate.

Prior manufacturing processes for forming mirror polished substrates typically include a high precision grinding step followed by a polishing step. Typically, the high precision grinding step is performed by placing the substrate into a high precision grinding machine. The high precision grinding machine usually yields a relatively flat substrate with a rough surface. Thereafter, the ground substrate is usually placed in a separate polishing machine that forms a mirror-polished surface on the substrate.

Such a high precision grinding machine usually applies a grinding wheel to a surface of the substrate. Prior grinding wheels are typically formed of epoxy impregnated with diamonds. Typically, the epoxy wheel rotates at high speeds and grinds away the surface of the substrate as the substrate rotates under the grinding wheel. This is called in-feed grinding. Such a high precision grinding machine typically includes a pair of air-bearing spindles that yield high precision thickness control and flatness of the resulting ground substrate. For example, prior high precision grinding machines commonly yield an overall thickness variation and TIR of the resulting ground substrate in the range of ±0.25 microns.

Thereafter, the ground substrate is typically placed in a polishing machine that removes the rough surface of the ground substrate. Prior polishing machines typically include a polishing pad and a chemical slurry. Such a polishing pad contacts the surface of the ground substrate to provide a mechanical component of substrate removal. In addition, the chemical slurry provides a chemical component of substrate removal. The mechanical and chemical components together usually yield a mirror-polished surface on the substrate.

Unfortunately, such prior polishing machines that use a polishing pad usually degrade the high level of thickness control that was obtained with the high precision grinding machine. For example, a ground substrate having a thickness variation of 0.5 microns out of the high precision grinding machine can be degraded to a thickness variation of ±1.6 microns after polishing in prior polishing machines.

Such a high thickness variation on the surface of the silicon wafer substrate, for example, usually hinders the photolithographic techniques required to produce high density integrated circuit devices on the wafer substrate. Such high thickness variation usually hinders photolithography by preventing focus onto the silicon wafer substrate of a dense image having a shallow depth of field. Such limitations on photolithography usually limit the controllability of device manufacturing and decrease overall yield by such processes.

Moreover, the relatively high thickness variation caused by prior polishing machines typically hinders wafer bonding steps. One prior method of wafer bonding is illustrated in U.S. Pat. No. 4,638,552 of Shimbo et al. Prior wafer bonding techniques typically involve the formation of mirror-polished surfaces of silicon wafer substrates. During a pre-treatment step, hydrophilic surfaces are usually formed on each mirror-polished surface. Two opposing mirror-polished surfaces are then brought into intimate contact which usually yields hydrogen bonding between the two hydrophilic surfaces.

Unfortunately, the thickness variation inherent with prior polishing machines commonly forms wedged or wavy or convex or concave surfaces on the silicon wafer substrates that undergo wafer bonding. Such flatness variation can hinder hydrogen bonding when large gaps are formed between the opposing mirror polished surfaces. Such gaps can occur, for example, when a shallow portion of one mirror polished surface is positioned near a shallow portion of the opposing mirror polished surface. Such surface mismatches typically reduces the overall yield of such wafer bonding processes.

As a consequence, prior wafer bonding techniques often involve a wafer sorting step wherein pairs of wafers are examined for thickness variation and are then matched based upon the thickness variation profile that would likely yield good bonding. Unfortunately, such extra steps during the manufacturing process greatly increases the overall cost of forming such wafer bonded silicon substrates.

SUMMARY AND OBJECTS OF THE INVENTION

One object of the present invention is to provide an optically flat mirror-polished substrate without the use of conventional polishing machine that employs a polishing pad.

Another object of the present invention is to obtain an optically flat mirror-polished substrate without the loss of substrate thickness uniformity common with prior polishing machines that employ a polishing pad.

A further object of the present invention is to provide a polishing tool that replaces the grinding wheel of a high precision grinder and that converts the high precision grinder into a high precision polishing machine.

These and other objects are provided by a polishing tool having a polishing wheel that forms a set of pockets. The pockets receive a stream of dilute ammonium hydroxide in water and are formed such that a high hydrostatic pressure builds in the pockets as the polishing tool rotates in a high precision grinder and addresses a surface of a substrate. The high hydrostatic pressure removes material from the surface of the substrate with the precision provided by the high precision grinder.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which:

FIG. 1 illustrates a polishing tool that converts a high precision grinding machine into a high precision polishing machine;

FIG. 2 is a top cut-away view of the polishing tool addressing a silicon wafer substrate;

FIG. 2A is a close-up top cut-away view showing fluid dynamics within the pocket;

FIG. 3 provides another close-up view of the hydrodynamics within a pocket of the polishing tool and shows the relative motions of the polishing tool and the wafer substrate;

FIG. 4 provides a cut-away side view of a set of pockets addressing the surface of the silicon wafer.

DETAILED DESCRIPTION

FIG. 1 illustrates a polishing tool 20 for a high precision grinding machine (not shown). The polishing tool 20 converts the high precision grinding machine into a high precision polishing machine for mirror polishing a substrate. The substrate shown is a silicon wafer 10 mounted in the high precision grinding machine. The polishing tool 20 replaces a grinding tool (not shown) of the grinding machine and enables the formation of a high precision mirror-polished finish on a surface 12 of the silicon wafer.

One type of high precision grinding machine suitable for use with the polishing tool 20 is the Strasbaugh Model 7AA in-feed grinder. A variety of in-feed grinders available from other manufacturers are also suitable. A high-precision in-feed grinder such as the Model 7AA employs air-bearing spindles for precise thickness control. The precise thickness control provided by an in-feed grinder is retained as the silicon wafer 10 is precisely machined by the polishing tool 20.

The high precision grinding machine rotates the silicon wafer 10 in a counter-clockwise direction. In addition, the high precision grinding machine rotates the polishing tool 20 in a counter-clockwise direction. The polishing tool 20 rotates at a relatively high angular speed in comparison to the speed of rotation of the silicon wafer 10. In one embodiment, for example, the polishing tool 20 rotates at about 3000 revolutions per minute.

The polishing tool 20 includes a polishing wheel 24 and a shaft 22. The shaft 22 couples the polishing wheel 24 to the air-bearing spindle system provided by the high precision grinding machine.

The polishing wheel 24 includes a lip 26 that forms an internal cavity under the polishing wheel 24 to accommodate the positioning of a spout 30. A bottom surface of the lip 26 addresses the top surface 12 of the silicon wafer 10.

A set of pockets are formed into a bottom surface of the lip 26 all around the periphery of the polishing wheel 24. The pockets include a set of pockets 40–42. The spout 30 injects a stream of solution into each of the pockets 40–42 as well as the remaining pockets along the periphery as the polishing wheel 24 rotates. For example, a stream of water from the spout 30 enters the pocket 40 through an opening 60 in an interior surface of the lip 26 as the opening 60 rotates into position with respect to the spout 30. The pockets are formed to create a high hydrostatic pressure area on the surface 12 which removes swaths of silicon from the silicon wafer 10.

FIG. 2 is a top cut-away view of the polishing tool 20 and the silicon wafer 10. The spout 30 is shown injecting a stream of solution 50 through the opening 60 of the pocket 41. The spout 30 injects the stream of solution 50 into each of the pockets 40–42 as the polishing wheel 24 spins in a counter-clockwise direction at a high angular velocity.

During each revolution of the polishing wheel 24, the pockets 40–42 formed in a bottom surface of the lip 26 address a swath across the surface 12 of the silicon wafer 10. The swath is located between an interior surface 70 of the lip 26 and an external surface 72 of the lip 26. A cavity 28 formed in the interior of the polishing wheel 24 and bordered by the lip 26 accommodates the spout 30 and a solution supply (not shown) to the spout 30.

FIG. 2A is a close-up top cut-away view showing fluid dynamics within the pocket 41. The stream of water 50 enters the pocket 41 through the opening 60. The pocket 41 includes a deep area 64 and a shallow area 62. The shallow area 62 trails the deep area 64 as the polishing wheel 24 rotates. As the polishing wheel 24 spins at a high speed in a counter-clockwise direction, the water injected into the pocket 41 moves from the deep end 64 to the shallow end 62. The water in the pocket 41 rises in pressure during movement from the deep end 64 to the shallow end 62. The high angular velocity of the polishing wheel 24 combined with the shape of the pocket 41 creates an extremely high hydrostatic pressure in the shallow end 62. The high hydrostatic pressure causes removal of silicon from the surface 12 of the silicon wafer 10. The high hydrostatic pressure provides the mechanical component of silicon removal without the direct contact of the polishing tool to the surface 12 of the silicon wafer 10.

FIG. 3 provides close-up view of the hydrodynamics within the pocket 41. An arrow 100 indicates the direction of rotation of the pockets 40–42 and an arrow 102 indicates the direction of rotation of the silicon wafer 10. The deep end 64 of the pocket 41 is wider than the shallow end 62 of the pocket 41. The cross sectional area of the pocket 41 decreases in two dimensions as the water moves into the shallow end 62 and thereby enhances the formation of high hydrostatic pressures.

In other embodiments, other forms for the pockets 40–41 may be employed. For example, the pockets may have deep and shallow ends having substantially similar widths. In addition, the pockets may have wide and narrow ends having substantially similar depths. In either case, the narrowing of the pockets 40–41 in either a horizontal or vertical dimension or in both dimensions contributes to the increases in hydrostatic pressure in the trailing ends of the pockets.

FIG. 4 provides a cut-away side view of the pockets 40–42 addressing the surface 12 of the silicon wafer 10. The large hydrostatic pressures in the areas 82, 62 and 92 of the pockets 40–42 cause the lip 26 to ride on a cushion of water above the surface 12 of the silicon wafer 10 and provides a gap 80 between the polishing tool 20 and the silicon wafer 10.

In one embodiment, the hydrostatic pressure caused by the compression of the water in the pockets 40–42 provide a substantially mechanical component of silicon removal from the surface 12 of the silicon wafer 10.

In another embodiment, the stream of solution 50 includes a potassium hydroxide (KOH) additive that also provides a chemical component for removal of silicon from the surface 12 of the silicon wafer 10.

In yet another embodiment, the stream of water 50 carries a slurry that includes silica particles. However, the silica particles in this embodiment can wear the polishing tool 20 and reduce the useful life in comparison to other embodiments.

The key process parameters for removal of silicon from the silicon wafer 10 by the polishing tool 20 include the proximity of the polishing tool 20 to the surface 12 which corresponds to the gap 80. In addition, the angular speed of the polishing wheel 24 along with the viscosity and temperature of the stream of solution or slurry that is injected into the pockets 40–42 are also key process parameters.

In one embodiment, the high precision grinding machine that drives the polishing tool 20 includes a down-force meter that measures the down-force of the polishing tool 20 against the silicon wafer 10. Such down-force is related to the hydrostatic pressure on the shallow ends of the pockets 40–42 according to the angular speed of the polishing wheel 24. Such parameters are precisely controlled to ensure removal of silicon from the surface 12 of the silicon wafer 10 without causing the polishing tool 20 to crash on the surface 12.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A polishing tool for polishing a substrate with a high precision grinder, wherein the polishing tool comprises a polishing wheel having a lip positioned at a periphery of the wheel, the lip including a set of pockets formed therein, and a spout, having an end positioned adjacent to the pockets such that upon rotation of the polishing tool, the pockets receive a stream of water, the pockets being formed such that a high hydrostatic pressure builds in the pockets as the polishing tool rotates and the pockets receive said stream of water, and the tool addresses a surface of the substrate.

2. The polishing tool of claim 1, wherein each pocket is formed with a deep end that receives the stream of water and a shallow end that builds the high hydrostatic pressure.

3. The polishing tool of claim 2, wherein the shallow ends of the pockets trail the deep ends of the pockets as the polishing wheel rotates.

4. The polishing tool of claim 2, wherein the deep ends of the pockets are wider than the shallow ends of the pockets.

5. The polishing tool of claim 1, wherein each pocket is formed with a wide end that receives the stream of water and a narrow end that builds the high hydrostatic pressure.

6. The polishing tool of claim 5, wherein the shallow ends of the pockets trail the deep ends of the pockets as the polishing wheel rotates.

7. The polishing tool of claim 1, wherein the stream of water contains a solution that provides a chemical component of substrate removal.

8. The polishing tool of claim 7, wherein the solution is a potassium hydroxide solution.

9. The polishing tool of claim 7, wherein the solution provides a slurry that contains silica particles.

10. The polishing tool of claim 7, wherein the solution is ammonium hydroxide.

* * * * *